United States Patent
O'Grady et al.

(10) Patent No.: US 6,380,812 B1
(45) Date of Patent: Apr. 30, 2002

(54) DUAL-OSCILLATOR TRIM METHOD

(75) Inventors: Michael B. O'Grady, Lewisville; Robert J. Talty, Dallas; Keith L. Kendall, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/559,989

(22) Filed: Apr. 26, 2000

Related U.S. Application Data (60) Provisional application No. 60/152,836, filed on Sep. 8, 1999.

(51) Int. Cl.[7] ................................................. H03B 1/00
(52) U.S. Cl. ..................................... 331/44; 331/177 R
(58) Field of Search ............................. 331/44, 177 R, 331/57

(56) References Cited

U.S. PATENT DOCUMENTS 5,859,571 A * 1/1999 Lee et al. ..................... 331/53

* cited by examiner

Primary Examiner—Arnold Kinkead
(74) Attorney, Agent, or Firm—Dwight N. Holmbo; Wade James Brady, III; Frederick J. Telecky, Jr.

(57) ABSTRACT

A method for improving the accuracy, from ±2.5% to less than ±1%, and time, from 8 seconds to less than 4 seconds, for trimming the dual frequency of an integrated circuit oscillator while reducing the effects of transistor mismatch and power supply variations. This method picks trim values for the two frequencies using a combination of binary and linear searching techniques, and then performs tests to assure that the trimmed oscillator frequencies are well within specification. To save circuitry, the coarse adjust binary value (typically 4 bits) is shared between the two frequencies with only the fine adjust binary values (typically 3 bits) requiring separate values. This method compensates for the fact that the desired ratio between the two frequencies is not constant, but decreases as the coarse trim setting increases, and provides an optimal trim of the two desired oscillator frequencies by setting on-chip fuses.

15 Claims, 4 Drawing Sheets

DUAL-OSCILLATOR TRIM METHOD

This application claims priority under 35 USC § 119 (e)(1) of Provisional Application No. 60/152,836, filed Sep. 8, 1999.

BACKGROUND OF THE INVENTION

1. Field of the Invention

The present invention relates to oscillators and more specifically to the trimming of dual frequency integrated circuit (IC) oscillators.

2. Description of the Related Art

In the past, current has been used to control the speed of an integrated circuit oscillator. This has been accomplished with a circuit which uses the summing of a binary weighted current from a current mirror source to set an exact current to the oscillator. This invention provides a method which has been developed to optimize the trimming of this oscillator current.

Figures 1, 3:
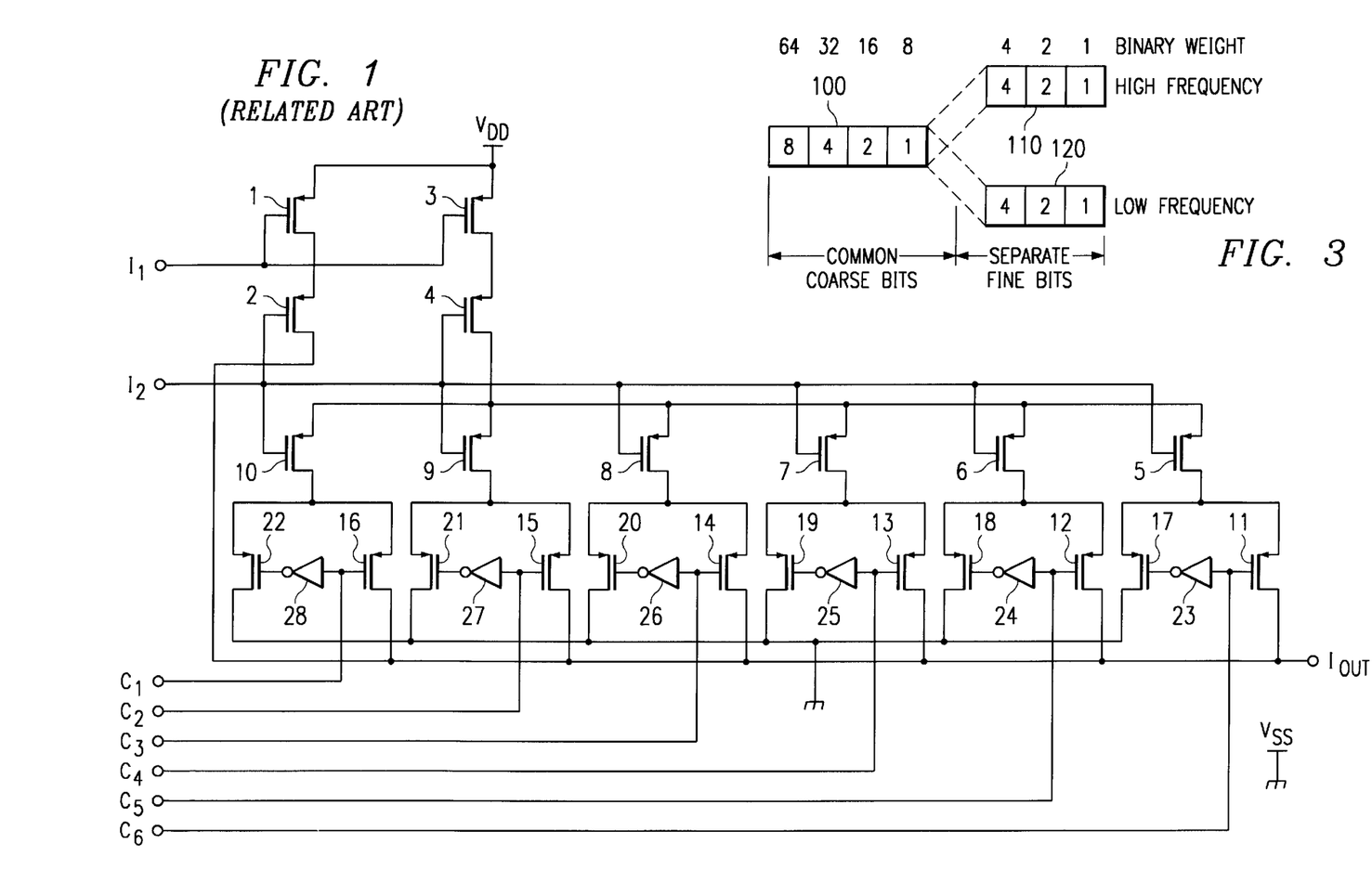
FIG. 1 is a schematic for a general circuit used to implement the oscillator trim function. (related art)
FIG. 3 is a diagram showing the common (coarse) bits and the separate (fine) bits used in the dual oscillator trim method of this invention.

FIG. 1 (related art) shows a current divide circuit used to implement the oscillator trim function. The general approach is to supply the reference oscillator current with a first current source and then to add binary weighted trim current from a second mirrored current source to generate the desired oscillator frequency. More specifically, current from the first current mirror 1–2 sets the normal reference oscillator current, while current from an identical current mirror 3–4 establishes the trim current which is binary weighted and added to the reference current. The binary trim is accomplished by means of a set of ratioed p-channel transistors 5–10 whose area (L×W) is made to decrease in binary fashion from the most significant bit 10 to the least significant bit 5. These transistors act as binary weighted load resistors to control the trim current in each leg. For example, during the layout of these transistors a typical design would be as follows:

| Transistor | L | W |
|---|---|---|
| 10 | 2 | 120 |
| 9 | 2 | 60 |
| 8 | 2 | 30 |
| 7 | 2 | 15 |
| 6 | 2 | 7.5 |
| 5 | 2 | 3.75 |

This ratio is set by the equation $$\text{ratio} = \frac{\Sigma T_w}{\Sigma T_{w(on)}}$$

where $T_w$ is the total width of all the trim transistors 5–10 and $T_w(\text{on})$ is the width of the trim transistors 5–10 which are turned on. Additional sets of complementary transistor switches are used to control the paths for the trim current. Each of these switches consists of two p-channel transistors and an inverter configured so that when one transistor is turned ON the other is turned OFF, depending on the binary state of it's input control line. In the circuit, transistors 11–16 are used to route the binary weight trim current through the ON bits to the output line and transistors 17–22 are used to route the binary weight trim current through the OFF bits to ground. Inverters 23–28 are wired to accomplish the complementary function of each switch set. In operation, input signals $I_1$ and $I_2$ are used to establish the reference and trim current in the two cascode current mirrors 1–2 and 3–4, respectively. The trim current is divided in binary fashion through transistors 5–10. Control lines $C_1$–$C_6$ are used to turn ON the desired complementary switches 11–16 and allow the binary weighted trim current $I_{out}$ to flow in the output line. For the unused binary weighted bits, where the trim transistors are turned OFF, the corresponding shunt transistors 17–22 are turned ON to direct this current to ground. Therefore, by changing the control inputs in real time, the oscillator trim current can be controlled. Generally, these oscillators are trimmed by choosing a target setting and testing to see if the frequency is within tolerance and if so, assuming that the chosen value is adequate. However, such an approach seldom results in optimal trimming of the oscillator and often is just within tolerance and may drift out of spec during operation in a critical application.

Figure 2A:
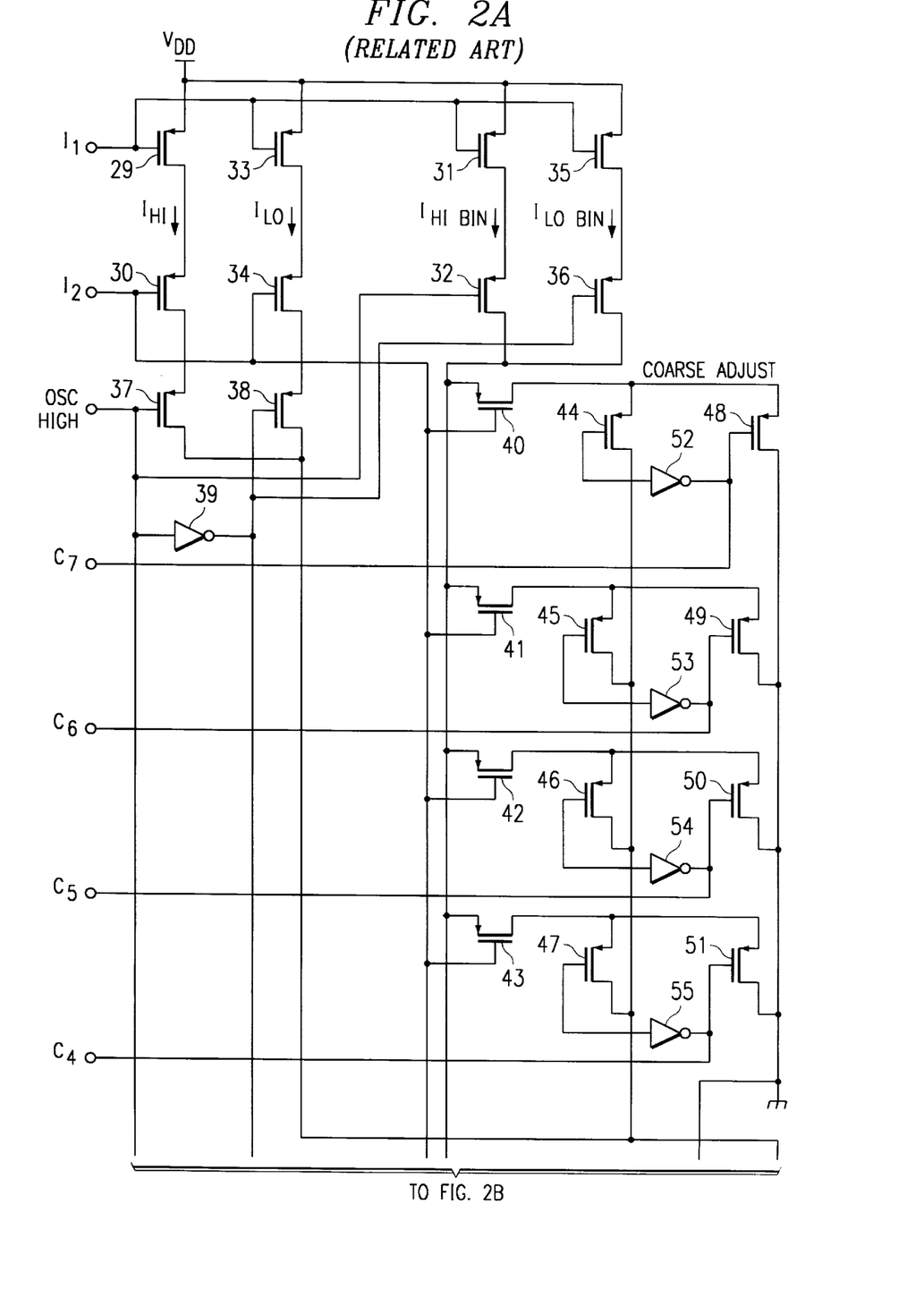
Figure 2B:
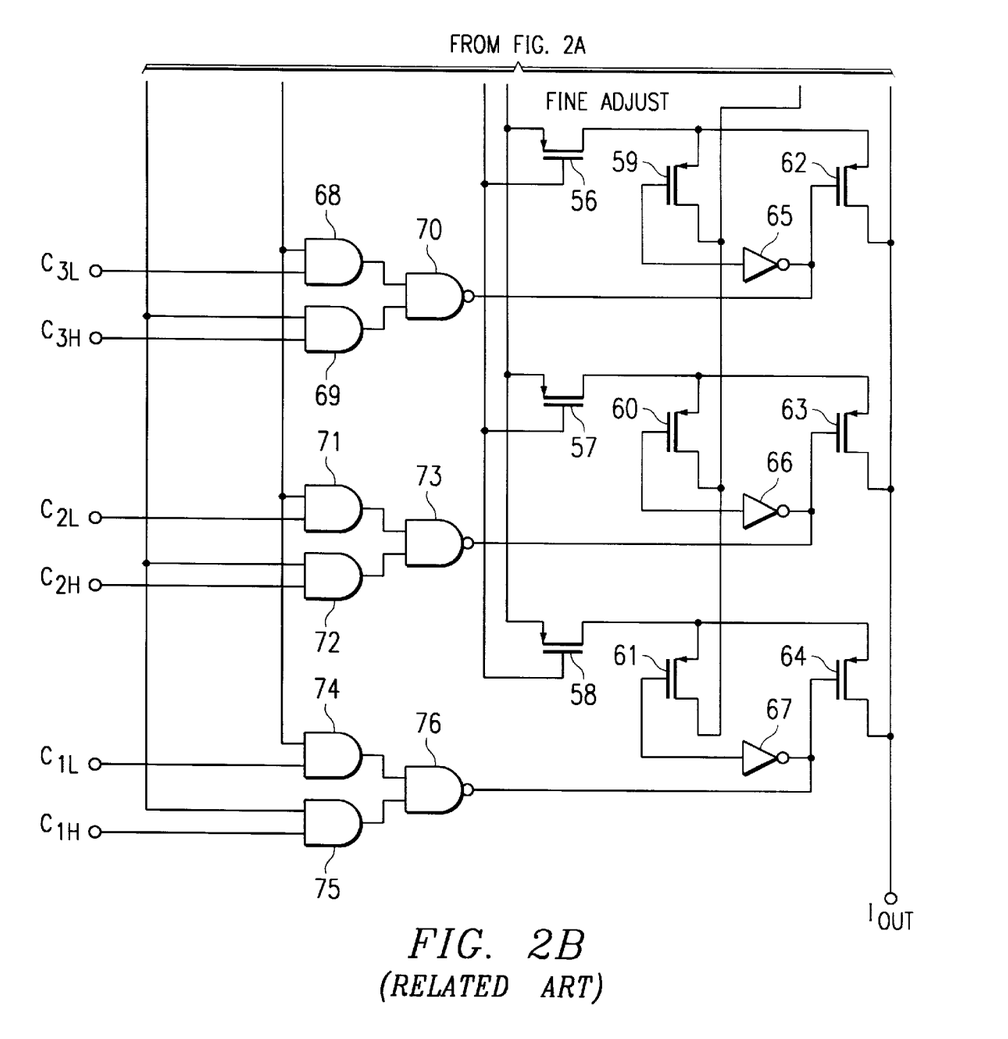

FIG. 2 (related art) shows another version of the circuit which has been used to implement the trim function for dual frequency oscillators. This circuit not only supplies dual frequency trim, but conserves silicon area by sharing 4 of the 1 binary trim control bits between the two oscillator frequencies. In this circuit, a second cascode current mirror, made up of transistors 33–36, is added-to the first cascode mirror, made up of transistors 29–32. Transistors 29–30 provide the reference oscillator current and transistors 31–32 provide the binary trim current for the high frequency while transistors 33–34 provide the reference oscillator current and transistors 35–36 provide the binary trim current for the low frequency oscillator. As mentioned above, the 7 trim control bits are divided into 4-bits, used for coarse trim adjust, and 3-bits used for fine trim adjust. In operation, the coarse adjust bits are shared between the two oscillator frequencies, while the fine adjust bits are controlled separately for each of the two oscillator frequencies. Transistors 40–43 and 56–58 are used to establish the binary weighted trim current for the coarse and fine trim bits, respectively. The area (L×W) of these transistors is scaled so as to decrease the current in each leg in a binary fashion, from most to least significant bit. Additional sets of complementary transistor switches are used to control the paths for the trim current. These switch pairs either select the binary weighted current from a bit, to be added as trim current to the oscillator or route unselected bit current to ground. Inverters are included in each switch pair so that when one transistor is turned ON the other is turned OFF, depending on the binary state of it's input control line. For the coarse trim bits, transistors 44–47 are used to route the binary weighted trim current through the ON bits to the output line and transistors 48–51 are used to route the binary weighted trim current through the OFF bits to ground. Inverters 52–55 are wired to accomplish the complementary function of each switch set. Similarly for the fine trim bits, transistors 62–64 are used to route the binary weighted trim current through the ON bits to the output line and transistors 59–61 are used to route the binary weighted trim current through the OFF bits to ground. Inverters 65–67 are wired to accomplish the complementary function of each switch set.

The coarse bits are turned ON and OFF by control signals $C_4$–$C_7$, which the fine bits are selected by logic circuits made up of gates 68–70, 71–73, and 74–76 for bits $C_1$–$C_3$. This logic allows for the fine trim bits to be controlled individually for the high and low frequencies $C_{1H}$ & $C_1L$, $C_{2H}$ & $C_{2L}$, and $C_{3H}$ & $C_{3L}$. Transistors 37–38 and inverter 39 are used to select high or low frequency operation for the fine trim circuitry. Due to the inverting nature of the fine bit control logic, opposite select transistors 62–64 are used relative to the coarse bits where transistors 44–47 are used. In operation, input signals $I_1$ and $I_2$ are used to establish the reference and trim current in the two cascode current mirrors. The trim current is divided in binary fashion through transistors 40–43 and 56–58. Control lines $C_1$–$C_7$ are used to turn ON the desired complementary switches 40–43 and 65–67 for the coarse and fine bits, respectively, and allow the binary weighted trim current $I_{out}$ to flow in the output line. For the unused binary weighted bits, where the trim transistors are turned OFF, the corresponding shunt transistors 48–51 and 59–61 are turned ON to directed this current to ground. Therefore, by changing the control inputs in real time, the oscillator trim current can be controlled.

Generally, these oscillators are trimmed by choosing a target setting and testing to see if the frequency is within tolerance and if so, assuming that the chosen value is adequate. However, such an approach seldom results in optimal trimming of the oscillator and often is just barely within spec, and as a result may drift out of spec during operation. A method is needed to assure that these oscillators are optimally trimmed near the center of the specification range so as to provide reliable operation in critical applications.

This invention provides a method that optimally trims dual frequency oscillators. The approach also allows for portions of the trim circuitry to be shared between two frequencies, thereby reducing amount of integrated circuitry required.

SUMMARY OF THE INVENTION

A method for accurately trimming the frequency of dual frequency integrated circuit oscillators in real-time by setting the desired frequencies by means of on-chip fuses. This method chooses the optimal trim for both oscillators by picking trim values for the two frequencies using a combination of binary and linear searching techniques. Additional testing is then carried out to assure that the trimmed oscillators frequencies are optimally within specification. In operation, this approach breaks the adjustment bits into coarse and fine bits and makes the coarse bits common between the two frequencies, resulting in an overall savings of hardware. The fine adjustment bits are not commonly shared and therefore are controlled separately. This method compensates for the undesirable effect that the ratio between the two frequencies is not constant, but decreases as the coarse trim setting increases. This provides optimal trim of the two desired oscillators frequencies, for the given conditions of common coarse bits. Basically, this method performs a binary search to find the optimal coarse value which is closest to the center of the overlap in the four common coarse bits and then performs a linear search on the three separate fine bits to provide the two desired frequencies which are optimally within specification. The primary advantages of this invention are speed accuracy in setting the trim of the oscillators.

The use of this method has been shown to reduced the trim adjustment time by about 50% from 8 seconds to less than 4 seconds and improved the trim accuracy from as poor as ±2.5% to better than ±1.0

DESCRIPTION OF THE VIEWS OF THE DRAWINGS

The included drawings are as follows:

FIGS. 2(A,B) is a schematic for the trim of a dual frequency oscillator using common coarse adjust bits. (related art)

DETAILED DESCRIPTION

The method of this invention-optimally trims dual internal oscillators of an integrated circuit by picking trim fuse values for the two oscillators using a combination of binary and linear searching techniques. Additional testing is then carried out to assure that the trimmed IC oscillators frequencies are well within specification. There are two stable current inputs to the circuitry used with this approach and output current $I_{out}$ which changes to provide the high and low oscillator frequencies. It is this output current that is adjusted (trimmed) by the steps in the method that sets the desired oscillator frequencies. For testing, the circuit's digital output is fed into a digital-to-analog converter (DAC) and then the time between the DAC's analog output pulses is measured to determine the oscillator's frequency. This process is adjusted in real-time to achieve the desired frequencies and then the appropriate bit control input fuses are blown to fixed the frequencies.

FIG. 3 is a typical example showing 7 trim bits with the 4 most significant bits 100 (coarse trim) being shared between t he oscillator's two frequencies and 3 separate trim bits 110 & 120 (fine trim) for each of oscillator's frequencies. However, as the coarse trim bit values are changed, the frequencies do not track linearly. For example, for a high frequency target of 19.2 Mhz and a low frequency target of 15.36 Mhz, actual values used with the MSP50C3x family of parts, there is a desired fixed frequency ratio of $$\text{ratio} = \frac{19.2}{15.36} = 1.25.$$

At low coarse trim values the desired frequency ratio of 1.25 can be achieved since there is a rather large overlap between the two scaled frequencies. However, as the coarse trim value increases, this ratio decreases and the overlap of the scaled frequencies becomes very narrow. So, in the case where the part being trimmed requires a low coarse trim value, it is quite easy to trim both oscillators simultaneously, but for the case where a higher coarse trim value is required, then this divergence results in a small overlap which makes trimming the two oscillators simultaneously more difficult. The basis for this method is that in choosing the coarse trim value, the scaled frequencies are averaged and then this average is used to find the optimal coarse value of not more than ±1% around the 0% trim value.

Figure 4:
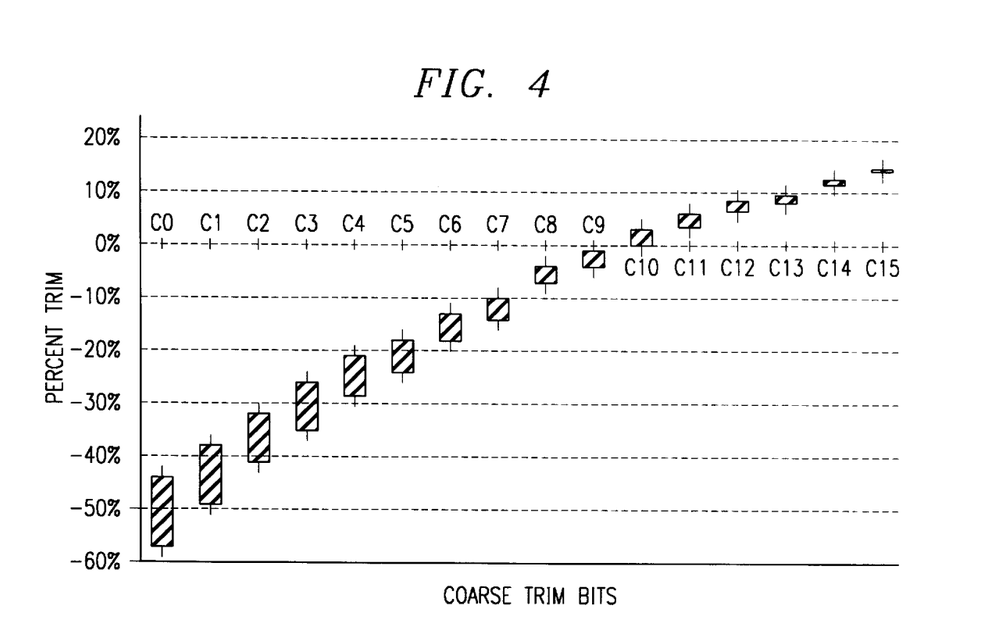
FIG. 4 shows the overlap between the two oscillator frequencies for the 16 combinations of the 4 coarse bits.

FIG. 4 shows the overlap (black bars) between the two oscillator frequencies for the 16 combinations (C0–C15) of the 4 coarse bits. As shown, there is a lot of overlap for the low coarse settings, but virtually none for the high coarse settings. This implies that it would be quite easy to trim the oscillators at low coarse settings but optimal trim only occurs when the coarse trim setting is closest to 0%, in this case for binary case C10 (1010).

Figure 5:
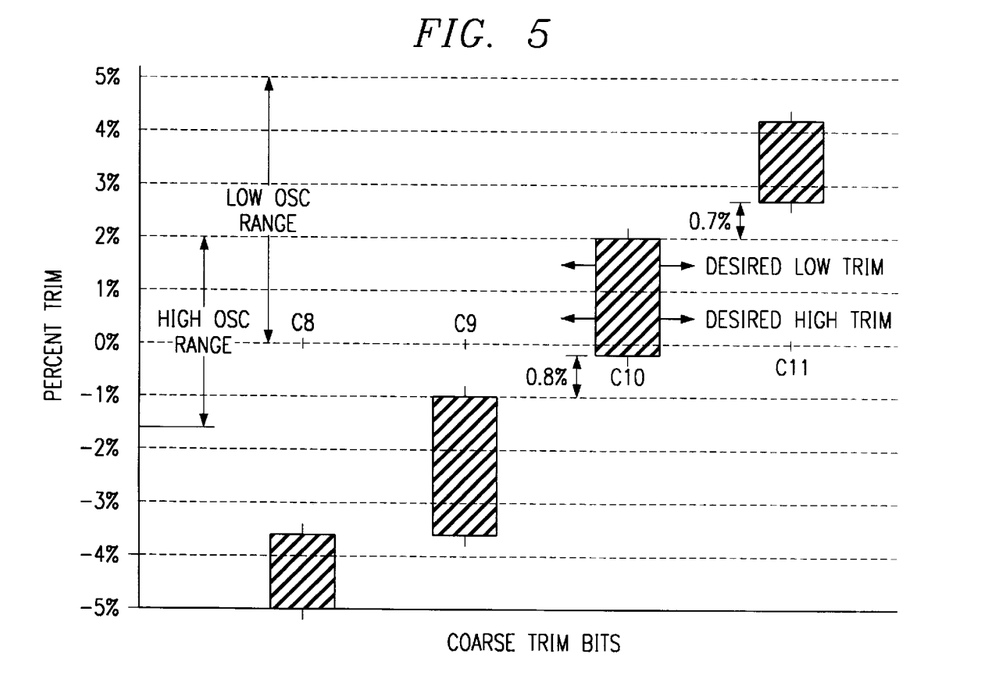
FIG. 5 is an exploded view of the region around C10 in for FIG. 4.

FIG. 5 is an exploded view of the region around C10 (C8–C11) in the above figure. This clearly illustrates the frequency overlap between the low oscillator and high oscillator. The optimal overlap, which gives a coarse trim nearest to 0% trim, is found at C10. This also shows that there may be non-overlap regions of 0.8% and 0.7%, respectively, between coarse settings C9–C10 and C10–C11. The goal is to set the fine trim for the two oscillators to be <1% in each case (desired), as indicated.

In general, the method of this invention searches for the closest coarse setting that results in 0% trim for the coarse bits based on the average of the high and low oscillator frequencies with the fine settings first set equal to 7 (FINE=7) and then with the fine settings set equal to 0 (FINE=0). This scaled average represents the middle of the overlap regions of the two oscillators, as shown at C10 in FIGS. 4 and 5 above. This approach will choose the coarse value which best satisfies both oscillator frequencies or if the divergence is high between the two, it will distribute the error equally between the two frequencies. The optimal coarse setting is found by making four binary passes as will be described later. Once, the coarse value is fixed, the fine adjust values for the desired low and high frequencies are determined by making linear scans. For the low frequency oscillator the scan starts with a value of 0 and continues up towards 7, stopping at the point where the low oscillator starts to diverge from the desired frequency. Similarly, for the high frequency oscillator the scan starts with a value of 7 and continues down towards 0, also stopping at the point where the high frequency start to diverge from the desired frequency. For both the low and high frequency cases, once divergence from the desired frequency occurs, the previous closest value is selected, yielding optimally trimmed oscillators.

The method of this invention is best described by means of an example, as follows. In this example, the desired frequency for the high frequency oscillator is HiTarget=19.2 MHz and the low frequency oscillator be LoTarget=15.36 MHz. The method's coarse adjust is implemented utilizing a simple binary tree traversal with four passes. However, the uniqueness is not in the binary search procedure, but rather in the simultaneous optimal trimming of two on-chip oscillator frequencies which in general do not track one another. Assume that the high and low oscillator frequencies result in coarse 4-bit settings of 9 (1001) and 6 (0110), respectively. This gives an desired average value of $$CTRIM = \frac{HiCoarse + LoCoarse}{2} = \frac{9+6}{2} = 7.5.$$

The coarse binary search will find the closest setting to the desired value of 7.5 in four passes. It starts with a value of 8 which is the approximate midpoint of the 4-bit field having a range from 0 to 15. Pass 1 starts with a coarse setting of 8 with an increment of ±4. If the result is too high, then the value is stepped down by 4 or if it is too low, the value is stepped up by 4. Next, for Pass 2 the increment is ½ of that for Pass 1, or ±2. Again, if the result is too large, the value is stepped down by 2 and if it is too small, the value is stepped up by 2. Pass 3 continues with an increment of ±1. Finally, Pass 4 is required to see if one of the previous tested adjacent values is closer. This process is illustrated in the two following binary tree transversals:

Example 1

Desired CRIM=7.5

Desired CTRIM=7.5;
   Pass 1—value 8 to high, decrement by −4 (4);
   Pass 2—value 4 too low, increment by +2 (6);
   Pass 3—value 6 too low, increment by +1 (7);
   Pass 4—check to see if any previous value is closer to desired value of 7.5;
   Value 7 or 8 are both acceptable, choose 8.

Example 2

Desired CTRIM=13

Desired CTRIM=13
   Pass 1—value 8 to low, increment by +4 (12);
   Pass 2—value 12 too low, increment by +2 (14);
   Pass 3—value 14 too high, decrement by −1 (13);
   Pass 4—check to see if any previous value is closer to desired value of 13;
   Value 13 is closest, choose 13.

In the case of the fine trim, either binary or linear scans are effective. However, in practice it is found that the low frequency oscillator will typically end up with a small trim value and the high frequency oscillator will typically have a high value. Therefore, a linear scan was chosen since the number of linear scans required is usually 5 or less and in the end a linear scan is usually faster. The final step in the procedure is to verify that the selected values are within the error budget by running the device again to assure that the error is ≦1.0%.

The trim method of this invention listed in pseudo code is shown below:
   Start;
      Call Choose Coarse for Fine=7;
      assign HiCoarse=result;
   Call Choose Coarse for Fine=0;.
      assign LoCoarse=result;
   Note: HiCoarse and LoCoarse are % of desired trim;
   Evaluate Coarse;
      If HiCoarse=LoCoarse, proceed to fine trim;

If HiCoarse≠LoCoarse, choose the average of the two oscillators $$CTRIM = \frac{HiCoarse + LoCoarse}{2};$$

Note CTRIM is the % trim error;
Choose Coarse Subroutine;
Find the closest coarse value;
Assign TryCoarse=8 (CBS08); coarse bin search
Do Bin Search Pass 1;
CBS08:±4;
   hi?→CBS04;
   lO?→cbs12;
Do Bin Search Pass 2;
CBS04: ±2;
   hi?→CBS2;
   lo?→CBS6;
CBS12: ±2;
   hi?→CBS10;
   lo?→CBS14;
Do Bin Search Pass 3;
CBS02: ±1;
   hi?→CBS1;
   lo?→CBS3;
CBS06: ±1,
   hi?→CBS5;
   lo?→CBS7;
CBS10: ±1;
   hi?→CBS9;
   lo?→CBS11;
CBS14: ±1;
   hi?→CBS13;
   lo?→CBS15;
If CBS01: Jump to Exit CC;
If CBS03: Jump to Exit CC;
If CBS05: Jump to Exit CC;
If CBS07: Jump to Exit CC;
If CBS09: Jump to Exit CC;
If CBS11: Jump to Exit CC;
If CBS13: Jump to Exit CC;
If CBS15: Jump to Exit CC;
Do comparison Pass 4
Exit CC, go to FINE TRIM;
Choose Fine Trim
Perform fine trim linear scan for two frequencies;
Perform housekeeping/cleanup/unit conversion/flags;
Verify that trim is ≦±1%;
If not, go back to start;
Complete.

Appendix A gives a listing of the code used with the dual oscillator trim method of this invention.

The use of this method has been shown to reduced the trim adjustment time by about 50% from 8 seconds to less than 4 seconds and improved the trim accuracy from as poor as ±2.5% to better than ±1.0%. In addition, by sharing the coarse adjust bits a savings in chip area of greater than 40%, from 12,500 square mils to 8,700 square mils is realized.

The dual frequency trim method of this invention can be used with any IC oscillator circuit which uses two cascode current mirrors, as described in the related art, and on-chip fuses to set the trim. An example of this is the C3X family of speech synthesizers, comprising the MSP50C34 and MSP50P34 chips. This method supports circuitry having only 2 current mirror stages, compared to 6 stages in some of the older designs. As a result, the circuit is less sensitive to transistor mismatch and the power supply rejection ratio error is improved.

While the invention has been described in the context of a preferred embodiment, it will be apparent to those skilled in the art that the present invention may be modified in numerous ways and may assume other embodiments other that that specifically set out and described above. Accordingly, it is intended by the appended claims to cover all modifications of the invention which falls within the true spirit and scope of the invention.

APPENDIX A

CODE FOR DUAL FREQUENCY TRIM METHOD

```
************************************************************************
                TEST BLOCK   FUSE: determine values (T=250)
************************************************************************

FUSEFIND:
      ASSIGN REFHIGH = 19200
      ASSIGN REFSLOW = 15360
      ASSIGN ERCOUNT = 0
    ; Begin The Frequency Test by doing a Binary Search
    ; of the Slow COARSE adjust

RERUN:

;BINSEARCH  Test COARSE Value Fuses
;               8                  Pass1
;             /   \
;       4            12        Pass2
;      / \          /  \
;    2     6      10    14     Pass3
;   / \   / \    / \   / \
;  1 3   5 7    9 11  13 15    Pass4
---------------------------------------------------------------
;BINSEARCH Pass 0
;   Test COARSE 8
        SENDPGM
          PLOAD       33COARSE.OBJ  ; Loads COARSE Frequency
Patterns
        ENDLIST
        FUNTEST EXQ COARSE8:    PRINTLN <COARSE = 8>
            SFLAG CONTINUE
          SENDPGM
            RUN   CH1000          ; Freq= High Fuse= 8
            ENDLIST
          FUNTEST EXQ
          CALL    FUSESIM
            ASSIGN  HFREQ = 10000-(FREQMEA/REFHIGH)
          SENDPGM
            RUN  CL1000           ; Freq= Slow Fuse= 8
          ENDLIST
          FUNTEST EXQ
          CALL    FUSESIM

ASSIGN LFREQ = 10000-(FREQMEA/REFSLOW)
            ASSIGN CTRIM = (HFREQ+LFREQ)

CALL ABSCTRIM
            ASSIGN C8=ABSTEMP
            COMPARE CTRIM >= 0
                JUMP TRUE, COARSE12
                JUMP  COARSE4      fall through
```

```
-------------------------------------------------------------------------
; BINSEARCH Pass 2
;       Test COARSE 4, 12

COARSE4:    PRINTLN <COARSE = 4>
            SENDPGM
              RUN       CH0100          ; Freq= High Fuse= 4
            ENDLIST
            FUNTEST EXQ
          CALL    FUSESIM
            ASSIGN  HFREQ = 10000-(FREQMEA/REFHIGH)
            SENDPGM
              RUN   CL0100              ; Freq= Slow Fuse= 4
            ENDLIST
            FUNTEST EXQ
            CALL    FUSESIM ASSIGN LFREQ = 10000-(FREQMEA/REFSLOW)
            ASSIGN CTRIM = (HFREQ+LFREQ)
              CALL ABSCTRIM
              ASSIGN C4=ABSTEMP
              COMPARE CTRIM >= 0
                 JUMP TRUE, COARSE6
                 JUMP COARSE2 ;end of 4

COARSE12:   PRINTLN <COARSE = 12>
            SENDPGM
              RUN   CH1100              ; Freq= High Fuse= 12
              ENDLIST
              FUNTEST EXQ
          CALL    FUSESIM
            ASSIGN  HFREQ = 10000-(FREQMEA/REFHIGH)
            SENDPGM
              RUN   CL1100              ; Freq= Slow Fuse= 12
            ENDLIST
            FUNTEST EXQ
            CALL    FUSESIM ASSIGN LFREQ = 10000-(FREQMEA/REFSLOW)
            ASSIGN CTRIM = (HFREQ+LFREQ)
              CALL ABSCTRIM
              ASSIGN C12=ABSTEMP
              COMPARE CTRIM >= 0
                 JUMP TRUE, COARSE14
                 JUMP COARSE10         ;end of 12

-------------------------------------------------------------------------
; BINSEARCH Pass 3
;       Test COARSE 2,6,10,14

COARSE2:    PRINTLN <COARSE = 2>
            SENDPGM
              RUN   CH0010              ; Freq= High Fuse= 2
              ENDLIST
              FUNTEST EXQ
            CALL    FUSESIM
              ASSIGN  HFREQ = 10000-(FREQMEA/REFHIGH)
            SENDPGM
              RUN   CL0010              ; Freq= Slow Fuse= 2
            ENDLIST
```

```
              FUNTEST EXQ
              CALL    FUSESIM

ASSIGN LFREQ = 10000-(FREQMEA/REFSLOW)
              ASSIGN CTRIM = (HFREQ+LFREQ)
                CALL ABSCTRIM
                ASSIGN C2=ABSTEMP
                COMPARE CTRIM >= 0
                    JUMP TRUE, COARSE3
                  JUMP COARSE1    ;end of 2

COARSE6:      PRINTLN <COARSE = 6>
              SENDPGM
                RUN  CH0110           ; Freq= High Fuse= 6
              ENDLIST
              FUNTEST EXQ
              CALL    FUSESIM
                ASSIGN  HFREQ = 10000-(FREQMEA/REFHIGH)
              SENDPGM
                RUN  CL0110           ; Freq= Slow Fuse= 6
              ENDLIST
              FUNTEST EXQ
              CALL    FUSESIM ASSIGN LFREQ = 10000-(FREQMEA/REFSLOW)
              ASSIGN CTRIM = (HFREQ+LFREQ)
                CALL ABSCTRIM
                ASSIGN C6=ABSTEMP
                COMPARE CTRIM >= 0
                    JUMP TRUE, COARSE7
                    JUMP COARSE5 ;end of 6

COARSE10:     PRINTLN <COARSE = 10>
              SENDPGM
                RUN  CH1010           ; Freq= High Fuse= 10
              ENDLIST
              FUNTEST EXQ
              CALL    FUSESIM
                ASSIGN  HFREQ = 10000-(FREQMEA/REFHIGH)
              SENDPGM
                RUN  CL1010           ; Freq= Slow Fuse= 10
              ENDLIST
              FUNTEST EXQ
              CALL    FUSESIM ASSIGN LFREQ = 10000-(FREQMEA/REFSLOW)
              ASSIGN CTRIM = (HFREQ+LFREQ)
                CALL ABSCTRIM
                ASSIGN C10=ABSTEMP
                COMPARE CTRIM >= 0
                    JUMP TRUE, COARSE11
                    JUMP COARSE9 ;end of 10

COARSE14:     PRINTLN <COARSE = 14>
              SENDPGM
                RUN  CH1110           ; Freq= High Fuse= 14
              ENDLIST
              FUNTEST EXQ
              CALL    FUSESIM
                ASSIGN  HFREQ = 10000-(FREQMEA/REFHIGH)
              SENDPGM
```

```
            RUN   CL1110            ; Freq= Slow Fuse= 14
         ENDLIST
         FUNTEST EXQ
         CALL      FUSESIM ASSIGN LFREQ = 10000-(FREQMEA/REFSLOW)
         ASSIGN CTRIM = (HFREQ+LFREQ)
           CALL ABSCTRIM
           ASSIGN C14=ABSTEMP
           COMPARE CTRIM >= 0

JUMP TRUE, COARSE13
           JUMP COARSE15    ;end of 14
```

---
; BINSEARCH Pass 4
;       Test COARSE 1,3,5,7,9,11,13,15

```
COARSE1:    PRINTLN <COARSE = 1>
            SENDPGM
              RUN   CH0001          ; Freq= High Fuse= 1
            ENDLIST
            FUNTEST EXQ
         CALL      FUSESIM
           ASSIGN  HFREQ = 10000-(FREQMEA/REFHIGH)
         SENDPGM
              RUN   CL0001          ; Freq= Slow Fuse= 1
           ENDLIST
           FUNTEST EXQ
           CALL      FUSESIM ASSIGN LFREQ = 10000-(FREQMEA/REFSLOW)
         ASSIGN CTRIM = (HFREQ+LFREQ)
           CALL ABSCTRIM
           ASSIGN C1=ABSTEMP
                ASSIGN F9=0
                ASSIGN F8=0
                ASSIGN F7=0
                ASSIGN F6=1
                STORE  FINEPAT,<33FINE1.OBJ>
            COMPARE C1<C2   ;C1 is best?
           JUMP TRUE FINETRIM ;Only 1 neighbor .: 1 test is enough
                ASSIGN F9=0
                ASSIGN F8=0
            ASSIGN F7=1
                ASSIGN F6=0
            STORE FINEPAT,<33FINE2.OBJ>
           JUMP FINETRIM REPEAT COARSE 1 FOR 3,5,7,9,11,13 and 15.
```

---
; Fine Trim
---

```
FINETRIM:
      PRINTLN
        PRINT <COARSE ADJUST= >
        ASSIGN CTRIM=8*F9+4*F8+2*F7+F6
      PRINTLN CTRIM          ;The coarse value we chose
      PRINT <     Fine= >    ;then print the fine value
```

```
        PRINTLN
        QPLOAD          FINEPAT    ; Loads FINE ADJUST Frequency
Patterns ---------------------------------------------------------------------
;       START SLOW FINE FREQUENCY TEST
;       Search starts from 000 and counts up
---------------------------------------------------------------------
L000:
            SENDPGM
                RUN  SL000
            ENDLIST
            FUNTEST EXQ

CALL FUSESIM
              CALL ABSSLOWTRY

L001:       ASSIGN SLOWFREQ = THISFREQ
            SENDPGM
                RUN  SL001
            ENDLIST
            FUNTEST EXQ
            CALL  FUSESIM
              CALL  ABSSLOWTRY

COMPARE  THISFREQ < SLOWFREQ
              JUMP TRUE, L010
              ASSIGN F5=0
              ASSIGN F4=0
              ASSIGN F3=0
            PRINTLN  <BLOW SLOW FINE 0 >
              JUMP SLEND

L010:       ASSIGN SLOWFREQ = THISFREQ
            SENDPGM
                RUN  SL010
            ENDLIST
            FUNTEST EXQ
            CALL  FUSESIM
              CALL  ABSSLOWTRY

COMPARE  THISFREQ < SLOWFREQ
              JUMP TRUE, L011
            PRINTLN <BLOW SLOW FINE 1>
              ASSIGN F5=0                        ; BLOW SLOW FINE 1
              ASSIGN F4=0
              ASSIGN F3=1
            JUMP SLEND

L011:    ASSIGN SLOWFREQ = THISFREQ
            SENDPGM
                RUN  SL011
            ENDLIST
            FUNTEST EXQ
            CALL  FUSESIM
              CALL  ABSSLOWTRY

COMPARE  THISFREQ < SLOWFREQ
              JUMP TRUE, L100
            PRINTLN <BLOW SLOW FINE 2>
              ASSIGN F5=0                        ; BLOW SLOW FINE 2
```

```
                    ASSIGN F4=1
                    ASSIGN F3=0
                    JUMP SLEND

L100:          ASSIGN SLOWFREQ = THISFREQ
                    SENDPGM
                        RUN    SL100
                    ENDLIST
                    FUNTEST EXQ
                    CALL    FUSESIM
                       CALL  ABSSLOWTRY

COMPARE  THISFREQ < SLOWFREQ
                    JUMP TRUE, L101
                    PRINTLN <BLOW SLOW FINE 3>
                      ASSIGN F5=0                      ; BLOW SLOW FINE 3
                      ASSIGN F4=1
                      ASSIGN F3=1
                    JUMP SLEND

L101:          ASSIGN SLOWFREQ = THISFREQ
                    SENDPGM
                        RUN   SL101
                    ENDLIST
                    FUNTEST EXQ
                    CALL    FUSESIM
                       CALL  ABSSLOWTRY

COMPARE  THISFREQ < SLOWFREQ
                    JUMP TRUE, L110
                    PRINTLN <BLOW SLOW FINE 4>
                      ASSIGN F5=1                      ; BLOW SLOW FINE 4
                      ASSIGN F4=0
                      ASSIGN F3=0
                    JUMP SLEND

L110:          ASSIGN SLOWFREQ = THISFREQ
                    SENDPGM
                        RUN   SL110
                    ENDLIST
                    FUNTEST EXQ
                    CALL    FUSESIM
                       CALL  ABSSLOWTRY

COMPARE  THISFREQ < SLOWFREQ
                    JUMP TRUE, L111
                    PRINTLN <BLOW SLOW FINE 5>
                      ASSIGN F5=1                      ; BLOW SLOW FINE 5
                      ASSIGN F4=0
                      ASSIGN F3=1
                    JUMP SLEND

L111:          ASSIGN SLOWFREQ = THISFREQ
                    SENDPGM
                        RUN   SL111
                    ENDLIST
                    FUNTEST EXQ
                    CALL    FUSESIM
                       CALL  ABSSLOWTRY

COMPARE   THISFREQ < SLOWFREQ
```

```
                ASSIGN F2=1                    ; BLOW FAST FINE 6
                ASSIGN F1=1
                ASSIGN F0=0
                JUMP SHEND

H100:           ASSIGN FASTFREQ = FASTTRY
                SENDPGM
                    RUN  SH100
                ENDLIST
                FUNTEST EXQ
                CALL  FUSESIM
                    CALL  ABSFASTTRY

COMPARE  FASTTRY < FASTFREQ
                JUMP TRUE, H011
                PRINTLN <BLOW FAST FINE 5>
                    ASSIGN F2=1                ; BLOW FAST FINE 5
                    ASSIGN F1=0
                    ASSIGN F0=1
                    JUMP SHEND

H011:           ASSIGN FASTFREQ = FASTTRY
                SENDPGM
                    RUN  SH011
                ENDLIST
                FUNTEST EXQ
                CALL  FUSESIM
                    CALL  ABSFASTTRY

COMPARE  FASTTRY < FASTFREQ
                JUMP TRUE, H010
                PRINTLN <BLOW FAST FINE 4>
                    ASSIGN F2=1                ; BLOW FAST FINE 4
                    ASSIGN F1=0
                    ASSIGN F0=0
                    JUMP SHEND

H010:           ASSIGN FASTFREQ = FASTTRY
                SENDPGM
                    RUN  SH010
                ENDLIST
                FUNTEST EXQ
                CALL  FUSESIM
                    CALL  ABSFASTTRY

COMPARE  FASTTRY < FASTFREQ
                JUMP TRUE, H001
                PRINTLN <BLOW FAST FINE 3>
                    ASSIGN F2=0                ; BLOW FAST FINE 3
                    ASSIGN F1=1
                    ASSIGN F0=1
                    JUMP SHEND

H001:           ASSIGN FASTFREQ = FASTTRY
                SENDPGM
                    RUN  SH001
                ENDLIST
                FUNTEST EXQ
                CALL  FUSESIM
                    CALL  ABSFASTTRY
```

```
              COMPARE   FASTTRY < FASTFREQ
              JUMP TRUE, H000
            PRINTLN <BLOW FAST FINE 2>
              ASSIGN F2=0                         ; BLOW FAST FINE 2
              ASSIGN F1=1
              ASSIGN F0=0
              JUMP SHEND

H000:       ASSIGN FASTFREQ = FASTTRY
            SENDPGM
               RUN  SH000
            ENDLIST
            FUNTEST EXQ
            CALL   FUSESIM
              CALL  ABSFASTTRY

COMPARE   FASTTRY < FASTFREQ
            JUMP FALSE, SH1
            PRINTLN <BLOW FAST FINE 1>
              ASSIGN F2=0                         ; BLOW FAST FINE 1
              ASSIGN F1=0
              ASSIGN F0=1
            ASSIGN FASTFREQ = FASTTRY
              JUMP SHEND
SH1:        PRINTLN <BLOW FAST FINE 0>
              ASSIGN F2=0                         ; BLOW FAST FINE 0
              ASSIGN F1=0
              ASSIGN F0=0

SHEND:
            PRINTLN
            PRINT <                    FASTFREQ: >
             PRINT FASTFREQ
             PRINTLN < %ER*100>
            PRINTLN
               COMPARE FASTFREQ > FTRIMER
                  JUMP TRUE, FASTFREQER

JUMP ENDFUSE

SLOWFREQER: ASSIGN ERCOUNT = ERCOUNT + 1
            COMPARE ERCOUNT = 2
               JUMP FALSE RERUN
            PRINTLN
               PRINT <SLOW FREQ %ERROR:>
               PRINT SLOWFREQ
               PRINTLN <  (N.NN%) >
               JUMP TRUE SIMERROR

FASTFREQER: ASSIGN ERCOUNT = ERCOUNT + 1
            COMPARE ERCOUNT = 2
               JUMP FALSE RERUN
            PRINTLN
               PRINT <FAST FREQ %ERROR:>
               PRINT FASTFREQ
               PRINTLN <  (N.NN%) >
               JUMP TRUE SIMERROR

ENDTEST ; END_OF_FUSEBLOW
```

```
SIMERROR:    PRINTLN <          FREQUENCY SIMULATION NOT IN SPEC>
             ERROR
FASTERROR:   PRINTLN <FAST FREQUENCY NOT IN SPEC>
             ERROR
ENDFUSE:     PRINTLN  <FREQENCY SIMULATION SUCCESSFUL>
             ENDTEST ; END_OF_FUSEFIND

**********************************************************************
;                    SUBROUTINE    ABSOLUTE VALUE
**********************************************************************

ABSCTRIM:    ASSIGN ABSTEMP = CTRIM
             COMPARE ABSTEMP < 0
             JUMP FALSE, ABSRET
             ASSIGN ABSTEMP = -ABSTEMP
             RETURN

ABSFASTTRY:  ASSIGN FASTTRY = 10000-(FREQMEA/REFHIGH)
             COMPARE FASTTRY < 0
             JUMP FALSE, ABSRET
             ASSIGN FASTTRY = -(FASTTRY)
             RETURN

ABSSLOWTRY:  ASSIGN THISFREQ = 10000-(FREQMEA/REFSLOW)
             COMPARE THISFREQ < 0
             JUMP FALSE, ABSRET
             ASSIGN THISFREQ = -(THISFREQ)
ABSRET:          RETURN

**********************************************************************
;                    SUBROUTINE    FUSESIM
**********************************************************************
FUSESIM:
             READ COUNT VALUE FROM DAC OUTPUT;

COMPARE COUNT = 0
             JUMP, TRUE COUNTER
             ASSIGN   FREQMEA = COUNT * 32 / 5 ; USE COUNT TO Calculate
FREQ
      PRINT COUNT
      PRINT < :COUNT>
      PRINT <      FREQUENCY MEASURED:>
      PRINTLN FREQMEA
             ASSIGN   FREQMEA = FREQMEA*10000
             RETURN COUNTER:     PRINTLN <ERROR:LOAD BOARD FREQ COUNTER NOT WORKING>
             ERROR
```

```
                JUMP FALSE, L1
                PRINTLN <BLOW SLOW FINE 6>
                   ASSIGN F5=1                        ; BLOW SLOW FINE 6
                   ASSIGN F4=1
                   ASSIGN F3=0

ASSIGN SLOWFREQ = THISFREQ
                   JUMP SLEND
        L1:     PRINTLN <BLOW SLOW FINE 7>
                   ASSIGN F5=1                        ; BLOW SLOW FINE 7
                   ASSIGN F4=1
                   ASSIGN F3=1

SLEND:
                PRINTLN
                  PRINT <SLOWFREQ: >
                  PRINT SLOWFREQ
                  PRINTLN < %ER*100>
                PRINTLN
                COMPARE SLOWFREQ > FTRIMER
                JUMP TRUE, SLOWFREQER

---------------------------------------------------------------
        ;    START FAST FINE FREQUENCY TEST
        ;    Search starts from 111 and counts DOWN
        ---------------------------------------------------------------
        H111:    SENDPGM
                    RUN   SH111
                 ENDLIST
                 FUNTEST EXQ
                 CALL  FUSESIM
                    CALL  ABSFASTTRY
                    ASSIGN FASTFREQ = FASTTRY H110:
                 SENDPGM
                       RUN   SH110
                 ENDLIST
                 FUNTEST EXQ
                 CALL  FUSESIM
                    CALL  ABSFASTTRY COMPARE  FASTTRY < FASTFREQ
                    JUMP TRUE, H101
                 PRINTLN <BLOW FAST FINE 7>
                    ASSIGN F2=1                       ; BLOW FAST FINE 7
                    ASSIGN F1=1
                    ASSIGN F0=1
                    JUMP SHEND H101:    ASSIGN FASTFREQ = FASTTRY
                 SENDPGM
                       RUN   SH101
                 ENDLIST
                 FUNTEST EXQ
                 CALL  FUSESIM
                    CALL  ABSFASTTRY COMPARE  FASTTRY < FASTFREQ
                    JUMP TRUE, H100
                 PRINTLN <BLOW FAST FINE 6>
```

We claim:

1. A method for accurately trimming a dual frequency oscillator frequency trim control bits, comprising the steps of:
   assigning adjustment bits to represent two desired frequencies, wherein said adjustment bits overlap;
   partitioning said adjustment bits into coarse and fine bits, wherein said coarse bits are common to both said desired frequencies and said fine bits are provided separately for each of said two desired frequencies;
   performing a binary search on said coarse bits to determine an optimal coarse bit value which is closest to the center of the overlap between said two desired frequencies; and
   performing a linear search on each of said fine bits to determine fine bit values associated with said two desired frequencies.

2. The method of claim 1 wherein a time required to provide optimal trim of said dual frequency oscillator frequency trim control bits is reduced to less than 4 seconds.

3. The method of claim 1 wherein a time required to provide optimal trim of said dual frequency oscillator is reduced to less than 4 seconds.

4. The method of claim 1 wherein a desired frequency ratio of a high frequency divided by a low frequency of said dual frequency oscillator is used as a target value in setting said optimal value.

5. The method of claim 4 wherein the average of said two desired frequencies is used to determine the optimal value.

6. The method of claim 5 wherein compensation is provided for any divergence from the desired frequency ratio as the optimal value increases.

7. The method of claim 6 wherein said optimal value of not more than ±1% around a 0% fine bit value is chosen.

8. A circuit for trimming a dual frequency on-chip oscillator frequency trim control bits, comprising:
   two cascode current mirrors;
   coarse bit adjust circuitry;
   fine bit adjust circuitry; and
   control bit inputs, wherein the dual frequency on-chip oscillator frequency trim control bits are accurately trimmed using a method comprising the steps of:
   assigning adjustment bits to represent two desired frequencies, wherein said adjustment bits overlap;
   partitioning said adjustment bits into coarse bits and fine bits, wherein said coarse bits are common to each of said two desired frequencies and said fine bits are provided separately for each of said two desired frequencies;
   performing a binary search on said coarse bits to determine an optimal coarse bit value which is closest to the center of the overlap between, said two desired frequencies;
   performing a linear search on each of said fine bits to determine fine bit values associated with said two desired frequencies; and
   setting said two desired frequencies by means of said coarse bit value and said fine bit values.

9. The circuit of claim 8 wherein a time required to accurately trim said dual frequency on-chip oscillator frequency trim control bits is reduced to less than 4 seconds.

10. The circuit of claim 8 herein a trim accuracy is better than ±1%.

11. The circuit of claim 8 wherein a desired frequency ratio of a high frequency divided by a low frequency of said dual frequency on-chip oscillator is used as a target value in setting said optimal value.

12. The circuit of claim 8 wherein said two cascode current mirrors are implemented to reduce transistor mismatching associated with said two cascode current mirrors.

13. The circuit of claim 12 wherein a power supply rejection ratio error is decreased due to less mismatch in transistors associated with said two cascode current mirrors.

14. The circuit of claim 11 wherein said two desired frequencies have an average value that is used to determine the optimal value.

15. The circuit of claim 14 in compensation is provided for any divergence from the desired frequency ratio as the optimal value increases.

* * * * *